US007076761B2

(12) United States Patent
Inanami et al.

(10) Patent No.: US 7,076,761 B2
(45) Date of Patent: Jul. 11, 2006

(54) METHOD FOR CREATING CHARGED-PARTICLE-BEAM EXPOSURE DATA, METHOD FOR MANUFACTURING SEMICONDUCTOR DEVICE, AND PROGRAM

(75) Inventors: Ryouichi Inanami, Yokohama (JP); Atsushi Ando, Tokyo (JP); Kazuhiro Nakai, Kyoto (JP); Yoshikazu Ichioka, Kyoto (JP)

(73) Assignees: Kabushiki Kaisha Toshiba, Tokyo (JP); Dainippon Screen MFG., Co., Ltd., Kyoto (JP)

( * ) Notice: Subject to any disclaimer, the term of this patent is extended or adjusted under 35 U.S.C. 154(b) by 293 days.

(21) Appl. No.: 10/642,680

(22) Filed: Aug. 19, 2003

(65) Prior Publication Data

US 2004/0117757 A1    Jun. 17, 2004

(30) Foreign Application Priority Data

Aug. 19, 2002   (JP)   ............................. 2002-238198

(51) Int. Cl.
*G06F 17/50*   (2006.01)
(52) U.S. Cl. .......................................... 716/21; 716/19
(58) Field of Classification Search .................. 716/21, 716/19; 250/492
See application file for complete search history.

(56) References Cited

U.S. PATENT DOCUMENTS 6,642,675 B1 * 11/2003 Ogasawara .................. 315/370
2003/0010933 A1 * 1/2003 Okino ...................... 250/491.1
2003/0160192 A1 * 8/2003 Inanami et al. ........ 250/492.23

FOREIGN PATENT DOCUMENTS

| JP | 10-303126 | 11/1998 |
| JP | 2001-257145 | 9/2001 |
| JP | 2002-151383 | 5/2002 |

OTHER PUBLICATIONS

Umagoe et al., Japanese Patent Application Publication No. 2001-257145 (English Translation), Sep. 21, 2001, Japanese Patent Office.*

(Continued)

*Primary Examiner*—Sun James Lin
(74) *Attorney, Agent, or Firm*—Finnegan, Henderson, Farabow, Garrett & Dunner, L.L.P.

(57) ABSTRACT

A method for creating charged-particle-beam exposure data containing a description of an exposure sequence of character patterns to perform exposure of a charged-particle-beam according to a character projection technique, comprising selecting first or second values as a parameter to transfer one character pattern and then transferring a subsequent character pattern, the first value regarding performance of a shaping deflector which deflects the charged particle beam so that the charged particle beam is applied to an arbitrarily character aperture formed in a CP aperture mask and a character beam having the shape of the character aperture is thereby created, and the second value regarding performance of an objective deflector which deflects the character beam so that the character beam is applied to an arbitrarily position of the deflection region of the specimen, and determining the exposure sequence of the character patterns in the deflection region in accordance with the selected parameter.

12 Claims, 10 Drawing Sheets

OTHER PUBLICATIONS

Inenami et al., Japanese Patent Application Publication No. 2003-173965 (English Translation), Jun. 20, 2003, Japanese Patent Office.*

Copy of "Notification of Reasons for Rejection," issued by the Japanese Patent Office on Apr. 26, 2005 in counterpart Application No. 2002-238198 and its English translation.

Inanami, R. et al., "Charged Particle Beam Exposure Method And Method For Producing Charged Particle Beam Exposure Data", U.S. Appl. No. 10/255,830, filed Sep. 27, 2002.

Inanami, R. et al., "Exposure Pattern Data Generation Apparatus Associated With Standard Cell Library And Charged Beam Exposure", U.S. Appl. No. 09/817,270, filed Mar. 27, 2001.

* cited by examiner

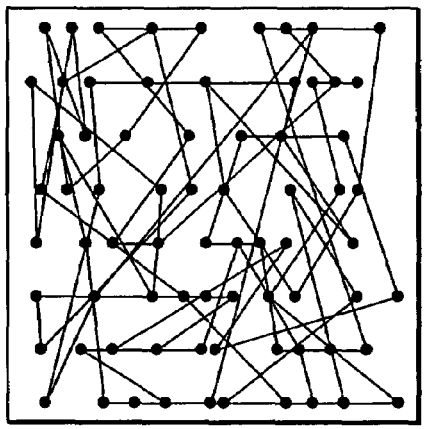 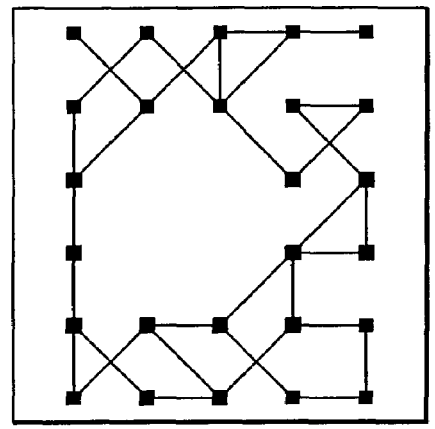
FIG. 14A  FIG. 14B
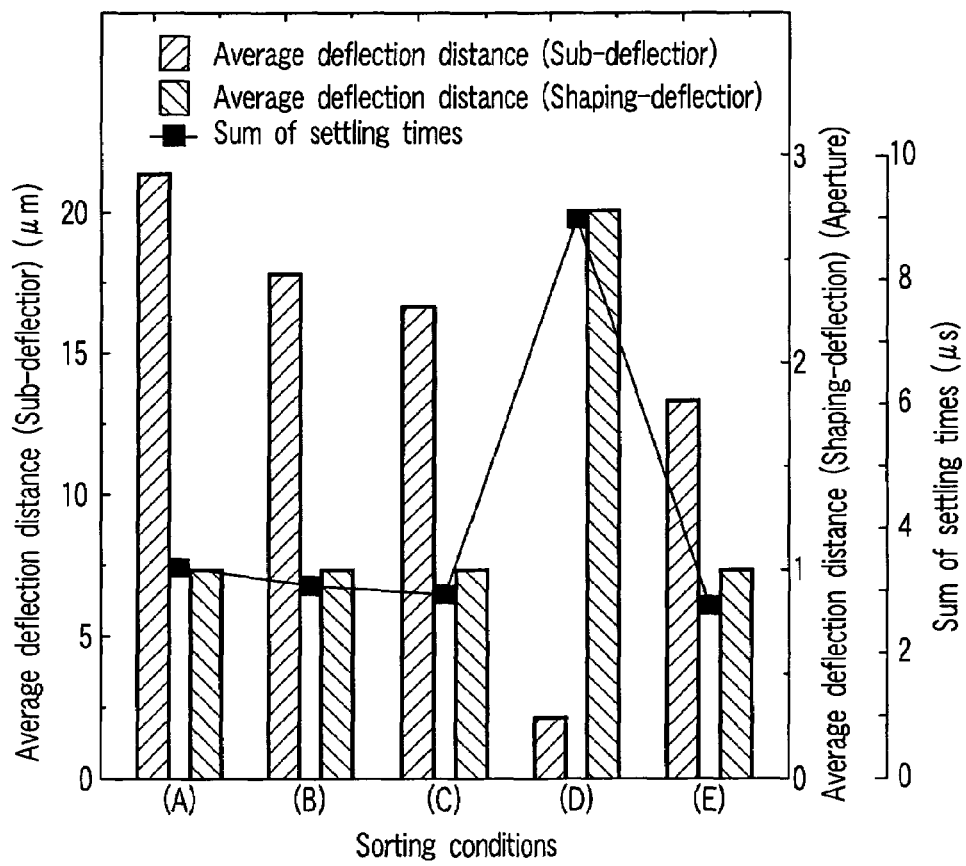
FIG. 15

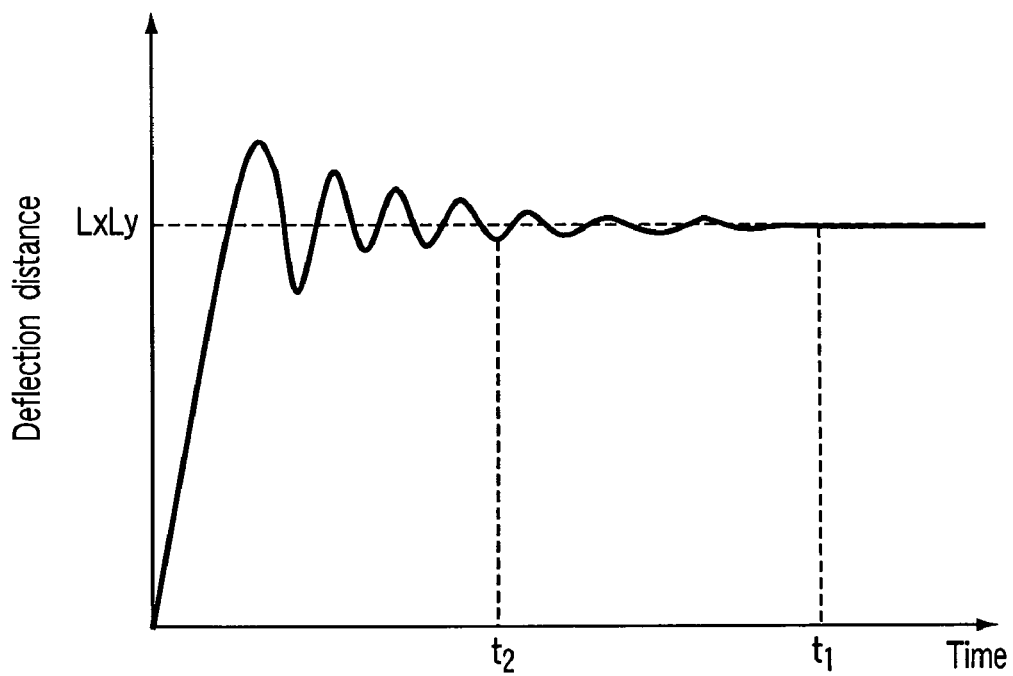
F I G. 18A
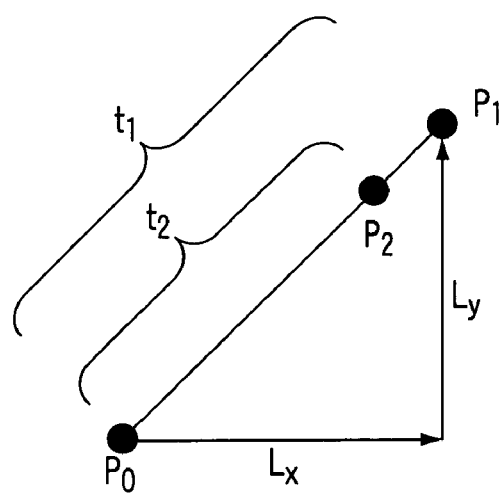
F I G. 18B

METHOD FOR CREATING CHARGED-PARTICLE-BEAM EXPOSURE DATA, METHOD FOR MANUFACTURING SEMICONDUCTOR DEVICE, AND PROGRAM

CROSS-REFERENCE TO RELATED APPLICATIONS

This application is based upon and claims the benefit of priority from the prior Japanese Patent Application No. 2002-238198, filed Aug. 19, 2002, the entire contents of which are incorporated herein by reference.

BACKGROUND OF THE INVENTION

1. Field of the Invention

The invention relates to a method for creating charged-particle-beam exposure data containing a description of an exposure sequence of character patterns when performing exposure of a charged particle beam according to a character projection technique; a program for creating exposure data; and a method for manufacturing a semiconductor device that uses the created exposure data.

2. Description of the Related Art

When writing device circuit patterns on resists over semiconductor substrates, electron beam lithography technology, particularly an electron-beam direct writing technique, does not require creation of masks, which are used as original patterns of circuit patterns, every devices. As such, the technology is used for prototype development and research/development in regard to cost reduction and QTAT (quick turn around time).

According to the electron beam lithography, a circuit pattern to be transferred is segmented into basic unititary patterns. Then, electron beams having the same shapes and sizes as those of the each unit pattern shaped using shaping aperture masks, and are then sequentially radiated over resists. Such a irradiation of the electron beam is alternatively expressed using the term "shot."

Techniques for shaping electron beams have two types. They are a variable shaped beam (VSB) technique and a character projection (CP) technique. In the VSB technique, a rectangular beam, which is shaped into a rectangular through a first shaping aperture mask, is partly applied to a rectangular aperture of a second shaping aperture mask, and a rectangular beam of an arbitrarily size is thereby created. In the CP technique, a rectangular beam shaped through a first shaping aperture mask is applied to an arbitrarily shaped aperture opened through a second shaping aperture mask, and a beam having the same shape as the aperture is thereby created. The aperture whose shape itself is a character shape is referred to as a "character aperture."

A second shaping aperture mask of the above-described type that has a plurality of character apertures and a VSB exposure rectangular aperture is referred to as a "character aperture mask" or "CP aperture mask." In addition, a "shaping deflector" refers to a deflector that deflects an electron beam shaped through the first shaping aperture mask. An electron beam is thus deflected using the shaping deflector, the electron beam is then applied to an arbitrarily or rectangular aperture of the CP aperture mask, and the electron beam is thereby shaped.

The electron beam shaped through the CP aperture is applied through an objective reflector composed of at least two main and sub deflectors onto specified positions of a semiconductor substrate that is to be exposed. Ordinarily, irradiation positions of the shaped electron beam to specimens are determined to be deflection regions divided corresponding to the main and sub deflectors. The main deflector is capable of deflecting a region larger than a region deflectable with the sub deflector; and the sub deflector is capable of deflecting a small region at a high speed.

The main deflector, sub deflector, and shaping deflector determines irradiation positions of electron beam onto the specimen and position of the character aperture for creating the shaped beam in the shape of the character pattern to be transferred. Voltage or current is applied to each of these deflectors via an amplifier for individual deflectors to attain a desired deflection amount. Specifically, voltage is applied to the deflector of an electrostatic type (electrostatic deflector), and current is applied to the deflector of an electromagnetic type (electromagnetic deflector).

Herein below, a case where electrostatic deflectors are used will be described referring to FIGS. 18A and 18B. Shown in the figures is the relationship between a settling time and a deflection distance in the case of deflection by the electrostatic deflector. As shown in FIG. 18A, it takes a time before a desired deflection region enters a setting state after application of voltage. Assume that an electron beam is desired to deflect by Lx and Ly in an x direction and a y direction in a sub deflection region. In this case, when an electron beam is applied with a shot after a time t1 has elapsed, the electron beam can be positioned in a precise manner from a present position P0 to a desired position P1 to write a pattern, as shown in FIG. 18B. However, when the electron beam is applied with a shot after a time t2 (t2<t1) shown in FIG. 18A has elapsed, the pattern is wrote at a position P2, which deviates from the position P1. This example corresponds to the following cases. One case is that, for example, when the shaping deflector is used; the beam is off from a character aperture that is to be selected. Another case is that, for example, when a rectangular beam is shaped using the VSB technique, the size of the shaped beam is varied. Another case is that when the main deflector is used, the position of a sub deflection region to be selected deviates, whereby patterns to be transferred with a shot before the beam reaches a setting level are caused to individually deviate from desired positions corresponding to the deviation in the position of the sub deflection region.

To prevent the problems described above, conventional electron-beam exposure apparatuses are designed as described hereunder. Like the time t1 shown in FIG. 18A, settling times are set as necessary for use as settling times for individual deflectors. More specifically, the settling times are set in units of each shot (for a sub deflector), in units of each selection of a sub deflection region (for a main deflector), and in units of each change in the shape of a character beam or a variable shaping beam (VSB) (for a shaping deflector).

The settling time (t1) necessary for each of the deflectors to deflect an electron beam increases and decreases depending on the deflection distance. As such, an electron-beam exposure apparatus has been proposed in which the settling time is set variably depending on the deflection length. In this case, since the sum of the settling times can be reduced, the throughput can be enhanced in comparison to a case where only fixed settling times are set.

In this case, however, a problem is held pending resolution in the shot sequence of character patterns. If the shot sequence of character patterns in sub deflection regions can be appropriately determined, the sum of deflection amounts of the sub deflectors can be reduced, and the total exposure time can be reduced, accordingly.

BRIEF SUMMARY OF THE INVENTION

According to one aspect of the invention, there is provided a method for creating charged-particle-beam exposure data containing a description of an exposure sequence of character patterns to perform exposure of a charged-particle-beam according to a character projection technique, comprising: selecting first or second values as a parameter to transfer one character pattern and then transferring a subsequent character pattern, the first value regarding performance of a shaping deflector which deflects the charged particle beam so that the charged particle beam is applied to an arbitrarily character aperture formed in a CP aperture mask and a character beam having the shape of the character aperture is thereby created, and the second value regarding performance of an objective deflector which deflects the character beam so that the character beam is applied to an arbitrarily position of the deflection region of the specimen; and determining the exposure sequence of the character patterns in the deflection region in accordance with the selected parameter.

According to another aspect of the invention, there is provided a program for implementing a function of creating exposure data containing a description of an exposure sequence of character patterns in a deflection region of a specimen when performing exposure of a charged particle beam according to a character projection technique, the program implementing: a function that works such that one of values is selected as a parameter when exposing one character pattern and then exposing a subsequent character pattern, the values including a value regarding performance of a shaping deflector which deflects the charged particle beam so that the charged particle beam is applied to an arbitrarily character aperture formed in a CP aperture mask and a character beam having the shape of the character aperture is thereby created, and a value regarding performance of an objective deflector which deflects the character beam so that the character beam is applied to an arbitrarily position of the deflection region of the specimen; and a function that works such that the exposure sequence of the character patterns in the deflection region is determined in accordance with the selected parameter, and the exposure data is thereby created.

BRIEF DESCRIPTION OF THE SEVERAL VIEWS OF THE DRAWING

FIGS. 14A and 14B depict electron beam trails associated with deflection by the sub deflector and the shaping deflector in accordance with the sorting condition (E);

FIG. 15 is a graph of calculation results of the deflection distances and settling times according to the sorting conditions (A) to (E);

FIGS. 18A and 18B is a view depicting the relationship a settling time and a distance of deflection by an electrostatic deflector.

DETAILED DESCRIPTION OF THE INVENTION

Embodiments of the invention will be described hereinbelow with reference to the drawings.

FIRST EMBODIMENT

Figure 1:
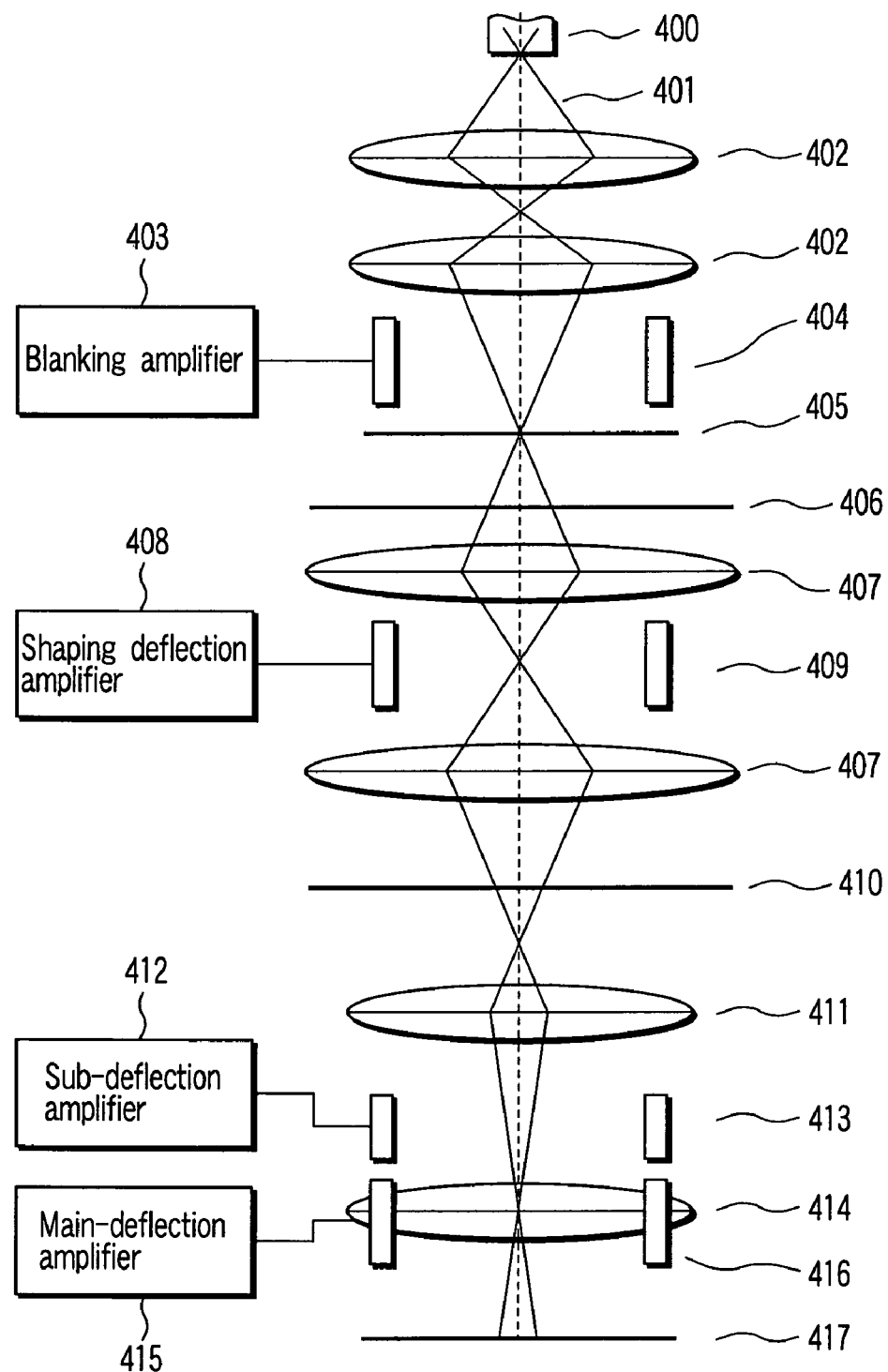
FIG. 1 is a view depicting an overall configuration of an electron-optical system of an electron-beam exposure apparatus according to a first embodiment of the invention.

FIG. 1 is a view depicting an overall configuration of an electrooptical system of an electron-beam exposure apparatus according to a first embodiment of the invention.

In exposure of circuit patterns of semiconductor devices by using the electron-beam exposure apparatus, a pattern to be transferred is segmented into small character patterns, and exposure of the character pattern to each of corresponding positions of specimens is iterated. Thereby, a device pattern is thereby formed. This will be described in greater detail hereinbelow.

An electron beam 401 emitted from an electron gun 400 is adjusted through a condenser lens 402 for current density, and uniformly illuminates a first shaping aperture mask 406. Irradiation is prevented from being provided to an area to which the electron beam 402 is not to be applied. This is implemented such that a deflection voltage is applied from a blanking amplifier 403 to a blanking deflector 404 to deflect the electron beam 401, and the electron beam 401 is blocked by a blanking aperture mask 405.

The electron beam 401 shaped rectangular through the first shaping aperture mask 406 is imaged over a second shaping aperture mask 410 (CP aperture mask) through a projection lens 407. In this instance, the electron beam 401 is shaped into a desired shape in the manner that a deflection voltage corresponding to the deflection amount of the electron beam 401 is applied from a shaping deflection amplifier 408 to a shaping deflector 409. As mentioned above, techniques for shaping the electron beam 401 include the variable shaping beam (VSB) technique and the character projection (CP) technique. In the VSB technique, a pattern is segmented into rectangular unitary patterns each having a size not larger than a maximum beam size, and exposures are performed thereonto. The irradiation position of the electron beam is caused to deviate through deflection by the shaping deflector 409 with respect to a VSB-dedicated aperture of the second shaping aperture mask 410 (CP aperture mask), whereby rectangular beams of arbitrary sizes are shaped and created, and the shaped pattern is used to transfer the each segmented patterns.

In the CP technique, characters of sizes not larger than the maximum beam size are extracted from a pattern, and character apertures in the shapes of the characters are disposed in the second shaping aperture mask 410. In this case, a plurality of character shapes can be used, an electron beam is deflected by the shaping deflector 409, and the deflected beam is applied to a desired aperture of the plurality of character apertures disposed. Thereby, the beam is shaped into the shape of the character aperture.

The electron beam 401 thus shaped is reduced through a reduction lens 411 and is then imaged over a specimen 417 via an objective lens 414. At this event, the electron beam 401 is deflected by a main deflector 416 and a sub deflector 413 (objective deflector), and is then applied to a desired position of the specimen 417. In this case, the main deflector 416 receives a deflection voltage applied from a main deflection amplifier 415, and the sub deflector 413 receives a deflection voltage applied from a sub deflection amplifier 412.

The procedure described above is repeatedly performed corresponding to exposure data containing a description of an exposure sequence of character patterns until all the character patterns are transferred. Such an exposure of the electron beam is alternatively expressed using the term "shot," as one exposure is called "one shot." To implement shots of the electron beam, as described above, at least the four deflectors 404, 409, 413, and 416 are required to be used, and application voltages to the deflectors are required to be varied.

Figures 2A, 2B, 2C:
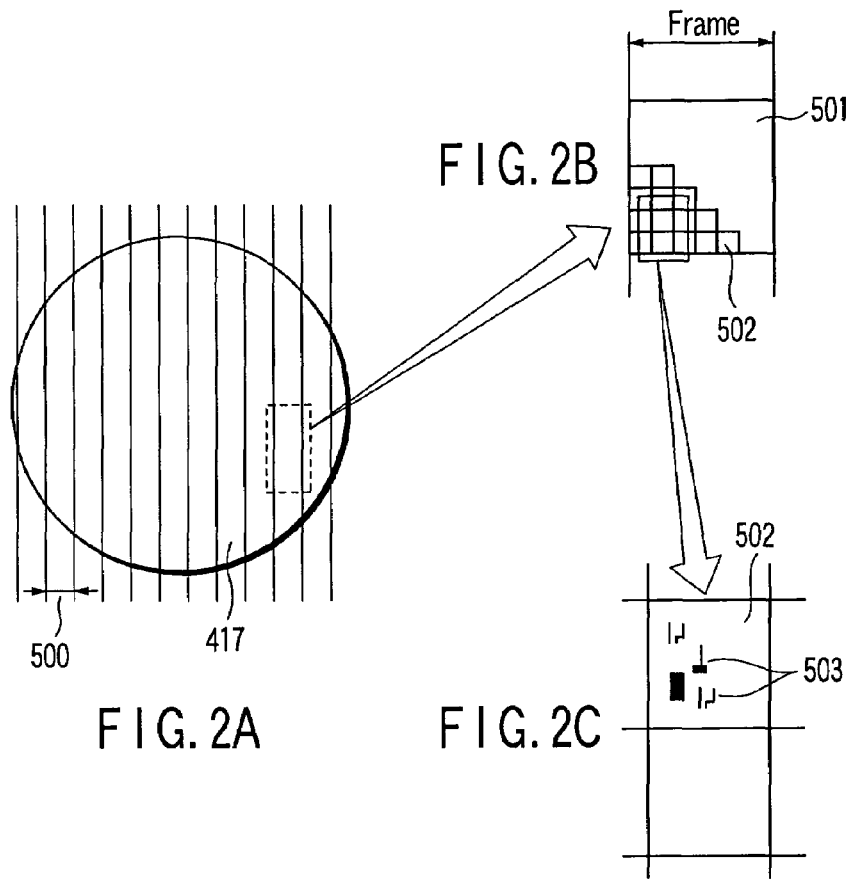
FIGS. 2A, 2B, and 2C schematically show the relationship between an exposure region and a shot in the exposure apparatus shown in FIG. 1.

The description is focused upon the main deflector and the sub deflector of the aforementioned deflectors. FIGS. 2A, 2B, and 2C show an exposure technique using these deflectors. The specimen 417 is set over a stage (not shown), the stage is moved continuously or step by step, and an electron beam is concurrently applied to the specimen 417. The unit in which the specimen 417 is moved with the stage is referred to as a "frame." As shown in FIG. 2A, frames 500 are each set in the form of a stripe to the specimen 417. That is, the specimen 417 is moved and exposed in units of the frame 500.

Each frame 500 is exposed in units of a main deflection region 501. Ordinarily, the main deflection region 501 has a size in a range from some hundreds of micrometers (μm) to some millimeters (mm). In many cases, the movement is done in units of the main deflection region 501 in a step-by-step system. In addition, as shown in FIG. 2C, the main deflection region 501 is exposed in units of a sub deflection region 502. Upon completion of exposure of patterns in the sub deflection region 502, the deflection voltage is applied to the main deflector, the electron beam is thereby deflected, and a sub deflection region 502 to be subsequently exposed is selected. Ordinarily, the size of the sub deflection region 502 is in a range from some tens of millimeters to some hundreds of micrometers (μm); and in many cases, the settling time of the deflection voltage to be applied from the main deflection amplifier is in a range from one to some microseconds (μs).

In the apparatus of first embodiment, the settling time of each deflector can be set in accordance with the deflection distance between shots of electron-beam electron beams.

A description will be provided hereinbelow regarding determination of a shot sequence in the electron beam exposure according to the CP technique. In this case, the shaping deflector 409 and sub deflector 413 of the electrostatic deflection type are used, and the determination is made in consideration of the characteristics of the individual deflectors. Of course, patterns for performing writing may include patterns for writing that is implemented on a shot basis by using the VSB technique. In this case, a character pattern is extracted, and exposure thereof can be implemented in a manner described hereunder.

To determine the shot sequence in the electron beam exposure according to the CP technique, the characteristics of the sub deflector 413 and the shaping deflector 409. Specifically, the settling time with respect to deflection distance of the electron beam deflected each of the deflectors needs to be considered.

Figure 3:
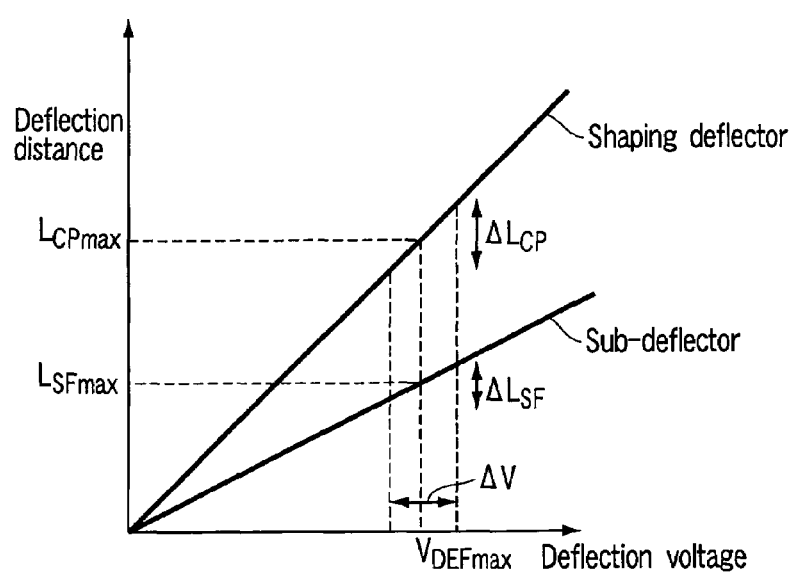
FIG. 3 is a view showing characteristics of each deflector in deflection distance with respect to deflection voltage.

FIG. 3 shows characteristics of each deflector in deflection distance with respect to deflection voltage. Shown in FIG. 3 are the characteristics in which a deflection voltage necessary for the sub deflector 413 to perform deflection for a size (distance) LSFmax of a sub deflection region is the same as a deflection voltage necessary to perform deflection for a maximum deflection amount LCPmax for the shaping deflector 409, and the deflection voltages are represented by VDEFmax. In a production application, however, voltage values of the two may be unequal to each other, and it is sufficient if expression can be implemented for the tilt in deflection voltage-deflection distance characteristics, that is, deflection sensitivities.

In the present case, the characteristics of the two deflectors are determined as described hereunder so that the settling time of the sub deflector 413 and the settling time of the shaping deflector 409 can be synchronously estimated from the deflection amounts.

An electron beam shaped by the CP aperture mask 410 is transferred to the specimen 417 through the reduction lens 411 at a magnification ratio of 1/M. As such, a deflection distance Lcp of the shaping deflector 409 is multiplied by 1/M, and the resultant data are indicated together with the characteristics of the sub deflector 413 in the same graph of FIG. 3.

In the graph, ΔLSF and ΔLCP represent a variation in the deflection distance of the electron beam deflected by the sub deflector 413 and a variation in the deflection distance of the electron beam deflected the shaping deflector 409, respectively, when a deflection voltage Vdef is varied by ΔV. Accordingly, ΔLSF/ΔV and ΔLCP/ΔV each indicate a deflection sensitivity, that is, an inclination of the characteristics.

In characteristics such as those shown in FIG. 18A, the settling time of the deflector extends longer as the variation amount of the deflection distance is longer.

The difference in the settling times associated with the deflectors is assumed to be proportional to the deflection sensitivity.

From the above, a settling time tSF of the sub deflector 413 is expressed by the following equation as a function f(x) of a deflection distance LSF:

$$t_{SF} = f(L_{SF}) \qquad (1)$$

Using the function f(x) used to calculate the settling time tSF, a settling time tCP of the shaping deflector 409 can be expressed by the following expression:

$$t_{CP} = \alpha \cdot f\left(\frac{L_{CP}}{M}\right) \quad (2)$$

In the above, α represents a ratio of the deflection sensitivities of the two deflectors. The ratio can be known from FIG. 3 to be as follows:

$$\alpha = \frac{\Delta L_{CP}/\Delta V}{\Delta L_{SF}/\Delta V} \quad (3)$$

According to specifications of the electron-beam exposure apparatus to be used, the maximum deflection distance ΔLSFmax of the electron beam deflected by the sub deflector 413 is 50 μm, the maximum deflection distance ΔLCPmax of the electron beam deflected the shaping deflector 409 is 1.6 mm, and the deflection voltages necessary to deflect the maximum deflection distances ΔLSFmax and ΔLCPmax are equally VDEFmax. Accordingly, a is obtained by ΔLCPmax/ΔLSFmax to be 3.2.

Figure 4:
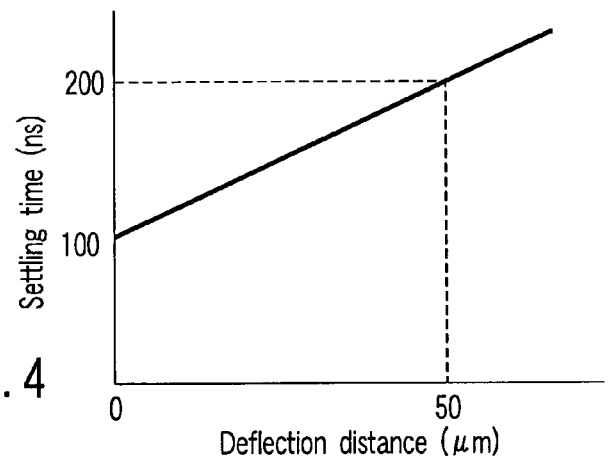
FIG. 4 is a characteristic diagram showing a settling time set for a sub deflector with respect to the deflection distance.

The settling time of the sub deflector 413 with respect to the deflection distance has characteristics as shown in FIG. 4, and is expressed by the following equation:

$$t_{SF} = f(L_{SF}) = \frac{200-100}{50}L_{SF} + 100 = 2L_{SF} + 100 \text{ [ns]} \quad (4)$$

Consequently, in the apparatus of the embodiment, according to equations (2) and (4) and the factors of "α=3.2" and a demagnification ratio M=10, the settling time tCP of the shaping deflector 409 is expressed by the following equation:

$$t_{CP} = 3.2 \times \left(\frac{2L_{CP}}{10}\right) + 100 \text{ [ns]} \quad (6)$$

Figure 5:
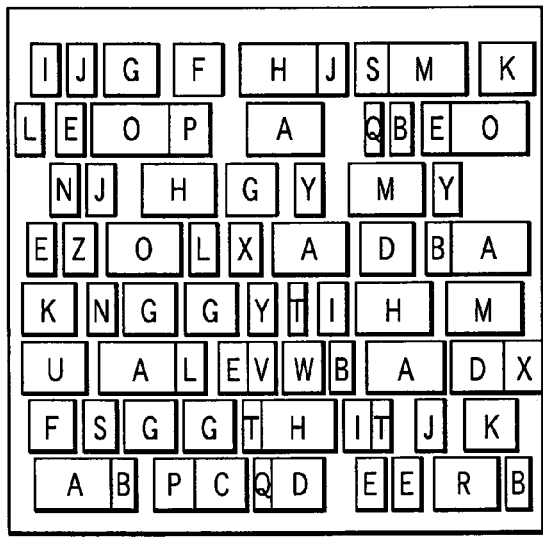
FIG. 5 is a schematic view depicting a pattern of a sub deflection region, which is one of device patterns.

A description is now made with reference to a pattern shown in FIG. 5 by way of an example to be transferred. The pattern corresponds to a sub deflection region 502 selected from a logic device circuit pattern. More specifically, in FIG. 5, rectangular patterns shown with the letters A to Z individually correspond to characters. These characters individually represent standard cells used in the logic device.

Figure 6:
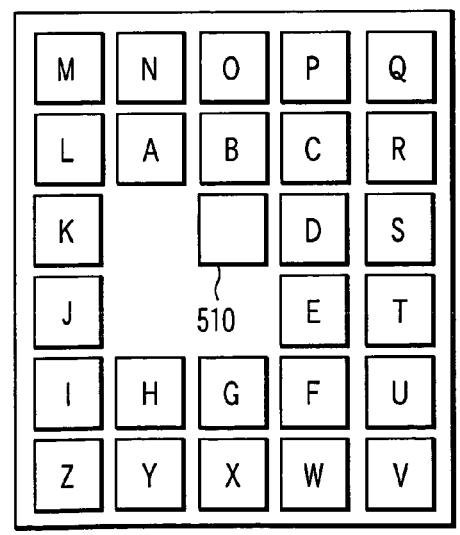
FIG. 6 is a plan view depicting a character aperture arrangement of a CP aperture mask to be used to perform electron beam exposure of the pattern shown in FIG. 5.

All the characters each has a size that allows irradiating by one shot of the electron beam. Character apertures corresponding to the individual characters are arranged over the second shaping aperture mask, as shown in FIG. 6. That is, using the characters of 26 types, the character patterns in the sub deflection region 502 can be exposed by 73 shots in total.

As shown in FIG. 6, character-shaped openings are formed in the blocks shown with the letters A to Z; that is, character apertures are formed therein. An aperture 510 for the VSB is formed in a central portion.

A description will now be provided regarding the case of electron-beam irradiating of patterns in the main deflection region 501 by using the CP technique. In specific, the shot sequence of the character beam will be described by reference only to the characters A to C selected for the convenience of description. That is, the case of three characters and 12 shots will be described.

The relation in the setting wait times in association with the two deflector units described above teaches that, even taking the demagnification ratio into account, the wait time of the shaping deflector unit 409 is relatively longer by a multiple of a. As such, ordinarily, unitary graphical patterns are exposed with shots in units of the character type. Specifically, after all unitary graphical patterns of one character type have been exposed with shots, the shaping deflector unit 409 is used to select a subsequent character aperture is selected, and a similar shot for subsequent unitary graphical patterns is repeatedly performed, and this procedure is repeatedly carried out for remaining patterns.

Figure 7:
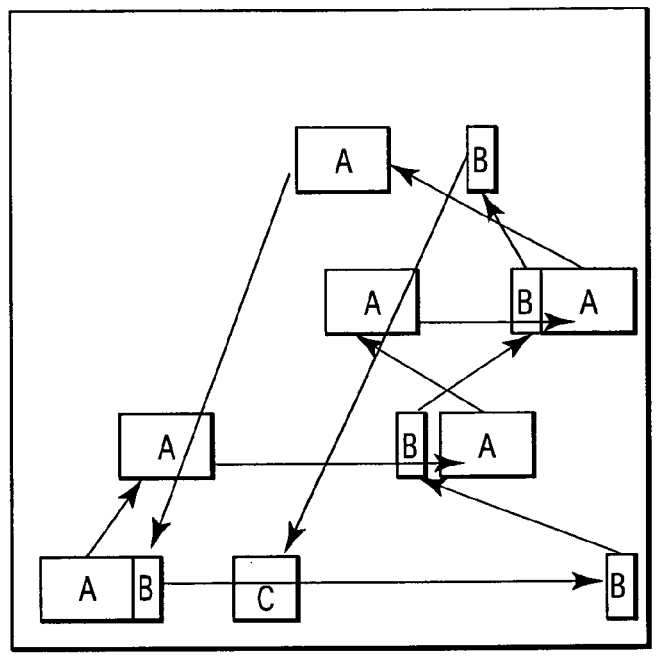
FIG. 7 is a view depicting a shot sequence of character patterns in accordance with a sorting condition (A)

Now, assume that shots are carried out in a sequence shown in FIG. 7 by way of the initial shot sequence. Character patterns are selected in the sequence of character apertures appearing in design data of a device pattern. Same character apertures are not sorted, and the shot sequence is determined following the sequence of appearance in the design data. The condition in this case is named a sorting condition (A).

In the character aperture arrangement shown in FIG. 6, when the shot sequence is determined to be the sorting condition (A), the characters are selected in the sequence A→B→C . . . . As such, sum of deflection distances of the electron beam deflected the shaping deflectors is happens to be minimum.

However, no regulations are placed for the arrangement of the character patterns in the sub deflection region. With the shot sequence as is determined as described above, not only the sum of deflection distances the electron beam deflected by the sub deflector 413 is increased, but also many long deflection distances associated with one deflection operation are included. Accordingly, the sum of settling times of the sub deflector 413 is increased. Consequently, not only the irradiating precision is deteriorated, but also the load of the apparatus is increased to ensure the positional precision at the settling time of long deflection.

Figure 8:
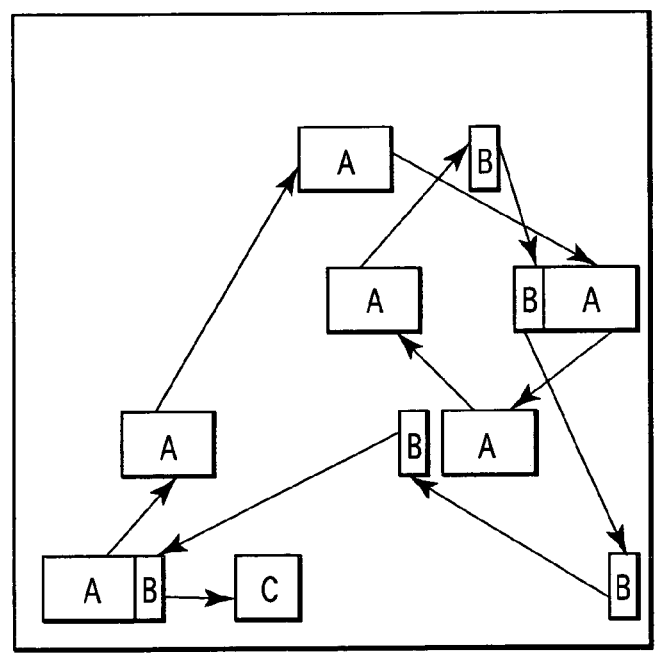
FIG. 8 is a view depicting a shot sequence of character patterns in accordance with sorting conditions (B) and (C)

Subsequently, similar to the case of the sorting condition (A), the shots of character patterns are repeatedly carried out in units of the character. Now, a description will be provided with reference to a case where shots for individual character patterns are sorted using a "traveling salesman problem" solution algorithm to minimize the sum of deflection distances of the electron beam deflected by the sub deflector 413. The condition in this case is named a sorting condition (B). FIG. 8 depicts a shot sequence determined in accordance with the sorting condition (B).

In addition, a sorting condition (C) refers to a condition in the case where the selection sequence for the character apertures is optimized to suppress a long deflection by the sub deflector 413. In the character aperture arrangement shown in FIG. 6, the sorting condition (B) and the sorting condition (C) produce the same results. These sorting conditions (A) to (C) are set such that shots are resorted in units of character patterns that use a same character aperture, so that the sum of deflection distances is reduced. In this case, however, unless otherwise character patterns using a same character aperture are arranged with high density in the sub deflection region, a long deflection shot through the sub deflector 413 is inevitably mixed.

As such, the shortest path (sequence for further reducing the sum of the deflection distances of electron-beam deflected the sub deflector 413) is obtained to avoid such long deflection shot. In this case, the character type is disregarded, attention is paid only to the arrangement positions of the character pattern in the sub deflection region, and the "traveling salesman problem" solution algorithm is used. The condition in this case is named a sorting condition (D).

Figure 9:
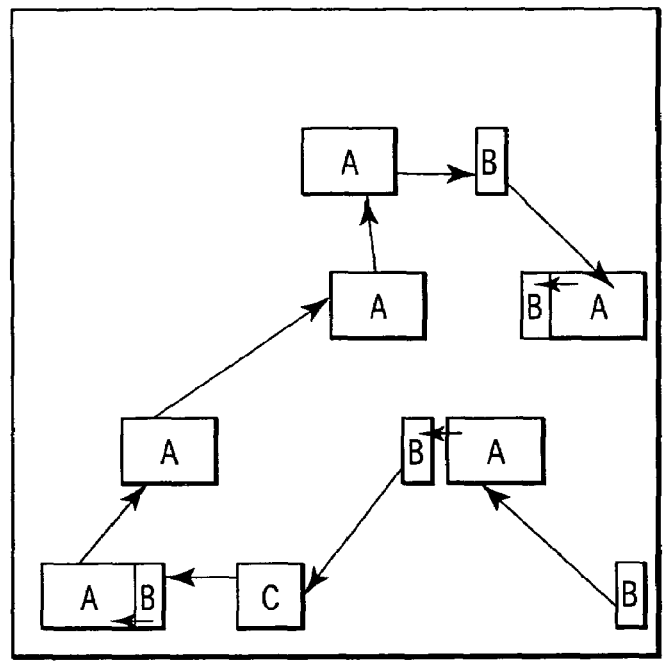
FIG. 9 is a view depicting a shot sequence of character patterns in accordance with a sorting condition (D)

FIG. 9 depicts a shot sequence determined in accordance with the sorting condition (D). As can be seen from shown in FIG. 9, the path is simple with a minimum distance. On the other hand, however, it can easily be predicted that the number of switching operations for character apertures is increased, and the deflection amount of the shaping deflector 409 at the time of switching is random, consequently increasing the total exposure time.

To this end, a description will now be made hereunder regarding a sorting condition (E) by way of one aspect of a method of first embodiment of the invention. In setting the sorting condition (E), restrictions for character switching are eliminated. Concurrently, the condition (E) is set such that a shot sequence is determined so as to reduce the total settling time of the two deflectors to be minimum in consideration of the characteristics of the settling times of the two deflectors, namely, the sub deflector 413 and the shaping deflector 409. More specifically, each settling time is determined in the following conditions:

1. When a settling time of the sub deflector 413 is longer than a wait time of the shaping deflector 409, the settling time of the sub deflector 413 is assumed as the settling time; and 2. Conversely, when the wait time of the shaping deflector 409 is longer, the settling time of the shaping deflector 409 is assumed as the settling time.

Figure 10:
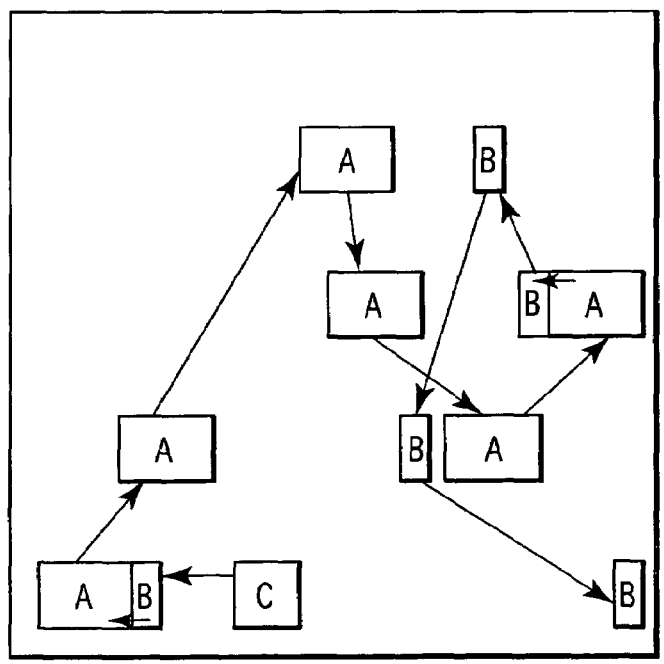
FIG. 10 is a view depicting a shot sequence of character patterns in accordance with a sorting condition (E)

Then, the "traveling salesman problem" solution algorithm is used to determine a shot sequence that enables the sum of the settling times determined in accordance with the above-described conditions to be further reduced. The shot sequence determined in accordance with the sorting condition (E) is depicted in FIG. 10. The sorting condition (E) avoids a shot that requires a long deflection by the sub deflector 413. In addition, character apertures are closely arranged, thereby enabling the implementation of flexible sorting that causes the deflection distance of electron-beam deflected the shaping deflector 409 to be reduced.

Table 1 shows the condition elements when the shot sequence is determined in accordance with each of the sorting conditions described above. The elements are the number of character-switching operations, the total deflection distance of the character beam that is associated with the deflection by the sub deflector, the number of long deflection shots associated with the deflection by the sub deflector, and the total settling time.

The number of long deflection shots through the sub deflector refers to the number of shots in the case where the deflection distance of the character beam in association with the sub deflector 413 is longer than 15 μm. In addition, the total settling time refers to the sum of settling times proposed with the sorting condition (E).

TABLE 1

| Sorting conditions | Number of character-switching operations | Total deflection distance (μm) | Number of large-deflection shots | Total settling time (ns) |
|---|---|---|---|---|
| (A) | 2 | 224.44 | 7 | 549 |
| (B), (C) | 2 | 163.33 | 5 | 483 |
| (D) | 8 | 108.89 | 1 | 552 |
| (E) | 3 | 131.10 | 2 | 451 |

As shown in Table 1, features of the individual sorting conditions are apparent. In addition, it can be verified that the technique in accordance with the sorting condition (E) reduces the total exposure time to be relatively smaller than those in the other methods.

Described below are the results of application of the sorting conditions (A) to (E) to the case where all the character patterns in one of the deflection regions shown in FIG. 5 are transferred.

Figure 11A:
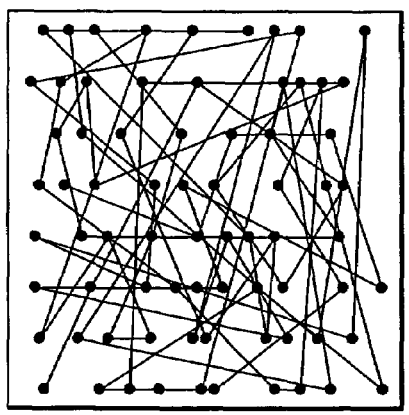
FIGS. 11A and 11B depict electron beam trails associated with deflections by a sub deflector and a shaping deflector in accordance with the sorting condition (B)
Figure 11B:
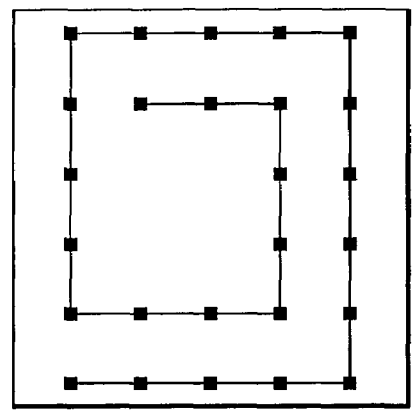

FIGS. 11A and 11B depict electron beam trails associated with deflections by the sub deflector and the shaping deflector in accordance with the sorting condition (B). Specifically, FIG. 11A is a plan view depicting the electron beam trails over the specimen in association with the deflection by the sub deflector. FIG. 11B is a plan view depicting the electron beam trails over the second shaping aperture mask in association with the deflection by the shaping deflector.

Figure 12A:
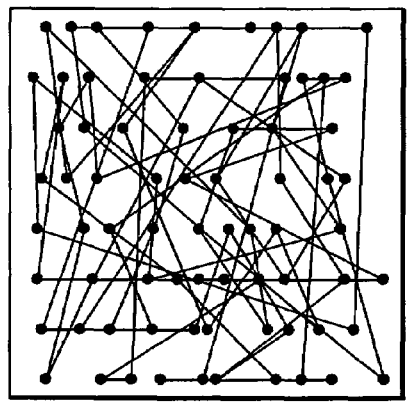
FIGS. 12A and 12B depict electron beam trails associated with deflection by the sub deflector and the shaping deflector in accordance with the sorting condition (C)
Figure 12B:
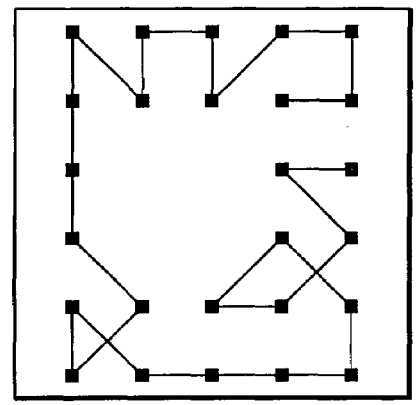

FIGS. 12A and 12B depict electron beam trails associated with deflections by the sub deflector and the shaping deflector in accordance with the sorting condition (C). Specifically, FIG. 12A is a plan view depicting the electron beam trails over the specimen in association with the deflection by the sub deflector. FIG. 12B is a plan view depicting the electron beam trails over the second shaping aperture mask in association with the deflection by the shaping deflector.

Figure 13A:
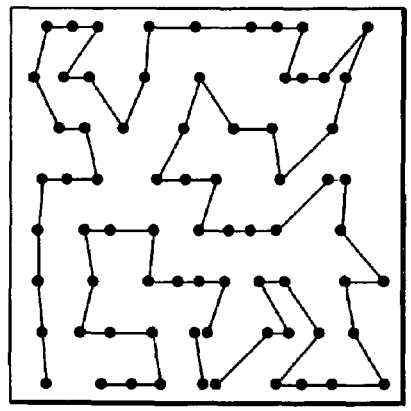
FIGS. 13A and 13B depict electron beam trails associated with deflection by the sub deflector and the shaping deflector in accordance with the sorting condition (D)
Figure 13B:
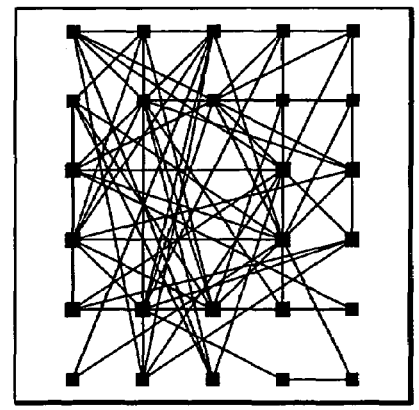

FIGS. 13A and 13B depict electron beam trails associated with deflections by the sub deflector and the shaping deflector in accordance with the sorting condition (D). Specifically, FIG. 13A is a plan view depicting the electron beam trails over the specimen in association with the deflection by the sub deflector. FIG. 13B is a plan view depicting the electron beam trails over the second shaping aperture mask in association with the deflection by the shaping deflector.

FIGS. 14A and 14B depict electron beam trails associated with deflections by the sub deflector and the shaping deflector in accordance with the sorting condition (E). Specifically, FIG. 14A is a plan view depicting the electron beam trails over the specimen in association with the deflection by the sub deflector. FIG. 14B is a plan view depicting the electron beam trails over the second shaping aperture mask in association with the deflection by the shaping deflector.

Table 2 below shows the results under the individual sorting conditions.

TABLE 2

| Sorting conditions | A | B | C | D | E |
|---|---|---|---|---|---|
| Number of character types | | | 26 | | |
| Number of shots | | | 73 | | |
| Number of character-switching operations | | 25 | | 69 | 40 |
| sub-deflector-unit total deflection distance (μm) | 1559.96 | 1300.08 | 1215.68 | 155.17 | 972.71 |
| sub-deflector-unit average deflection distance (μm) | 21.37 | 17.81 | 16.65 | 2.13 | 13.32 |
| Shaping-deflector-unit total deflection distance (mm) | | 1.875 | | 14.175 | 3.000 |
| Shaping-deflector-unit average deflection distance (μm) | | 75.00 | | 205.43 | 75.00 |
| Total settling time (μs) | 3.38 | 3.09 | 2.95 | 8.99 | 2.77 |

Essentials of the results shown in Table 2 are shown in FIG. 15. Specifically, FIG. 15 is a graph showing calculation results of individual deflection distances and inter-shot wait times in accordance with the sorting conditions (A) to (E).

Average deflection distances of electron-beam deflected the shaping deflector 409 are standardized with arrangement pitches of the character apertures to the CP aperture mask 410. An "average distance 1 aperture" implies that an adjacent character aperture has been selected.

The results prove that the sorting condition (E) enables the exposure time to be shortest and an average deflection distance of electron-beam deflected the sub deflector 413 can be appropriately reduced. Further, the results prove that the average deflection distance of electron-beam deflected the shaping deflector 409 can be reduced, and substantially adjacent character apertures are selected.

In more specific, the table showing the results and the graph shown in FIG. 15 verify that the sorting techniques for character shots according to the present embodiment have the following effects:

the total shot-wait time necessary for exposure of character patterns in the sub deflection region can be minimized;

the sum of deflection distances of electron-beam deflected the sub deflector 413 can be reduced, and long deflection shots can be suppressed; and while the total deflection distance of electron-beam deflected the shaping deflector 409 is somewhat increased, the distances necessary for one deflection can be arranged to be substantially adjacent.

In accordance with these effects, the effects described in the present embodiment are exhibited as described hereunder.

The throughput of exposure can be maximized in the case an exposure apparatus that allows settling times to be set corresponding to the settling times described above.

The per-shot deflection distance can be reduced. Consequently, not only positional deviations of shots, beam-shaping errors, and the like can be suppressed, irradiating precision can be improved, and the production yield can be improved, but also the performance of semiconductor devices to be manufactured can be improved.

Further, long deflections are reduced, and the one-deflection distances of electron-beam deflected the each deflector can be reduced. This leads to minimization of the loads imposed on, for example, a power source for supplying voltage to individual deflectors, amplifiers, and the apparatus. Consequently, semiconductor device development and maintenance of the exposure apparatus are facilitated, and concurrently, reductions in development costs for semiconductor devices and maintenance costs for the exposure apparatus can be expected to be implemented.

Furthermore, even when the settling times corresponding to the deflection distances as disclosed in the present embodiment cannot be set for individual deflectors, since long deflections are reduced, the load to be imposed on the exposure apparatus is significantly reduced. This is a significant effect.

SECOND EMBODIMENT

In a second embodiment of the invention, the exposure-data creation methods described in the first embodiment will be described in more detail hereinbelow.

Figure 16:
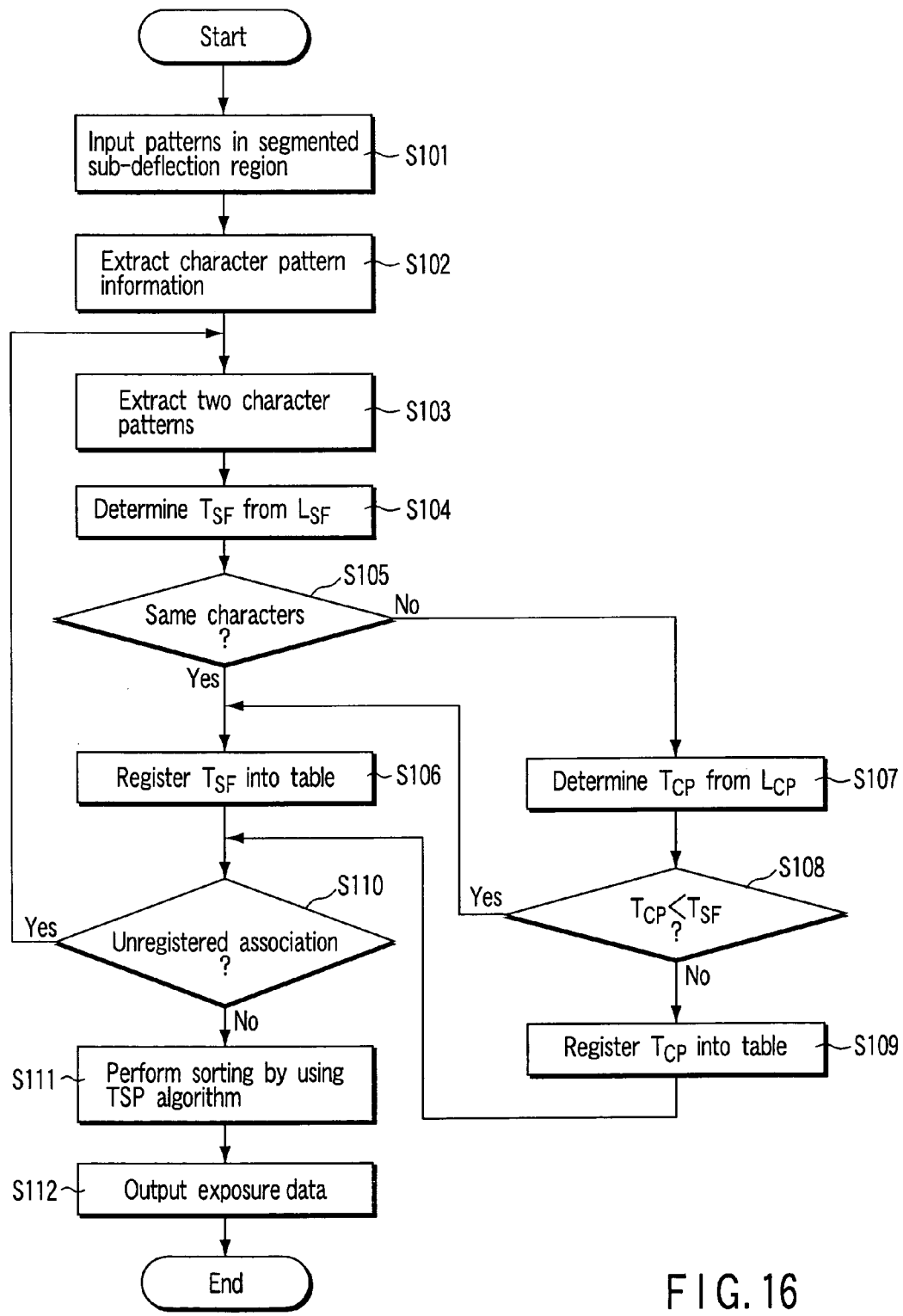
FIG. 16 is a flowchart of an exposure-data creation method according to a second embodiment of the invention.

FIG. 16 is a flowchart of an exposure-data creation method according to a second embodiment of the invention.

The exposure-data creation method may be implemented in a hardware configuration and/or a software configuration. In the case of a software configuration used for the implementation, a program for performing operation to implement corresponding functions is preinstalled into a computer from a storage medium or a network. This is the same for an apparatus according to each of other embodiments described below.

(Step S101)

Pattern data containing extracted character patterns is input. The pattern data is such that a circuit pattern of a semiconductor device to be transferred is segmented into a plurality of sub deflection regions, and character patterns contained in the individual sub deflection regions are extracted.

(Step S102)

Information of the individual character patterns contained in the sub deflection region is extracted from the input pattern data. Information extracted therein contains at least the positions of shots to a specimen for the individual character patterns and the type of a character aperture for the character patterns.

(Step S103)

Two character patterns are extracted from those contained in one of the sub deflection regions.

(Step S104)

One of the character patterns is transferred with a shot from the shot positions for the two character patterns extracted in step S103. Subsequently, the operation calculates a deflection distance LSF of a character beam that is to be deflected by a sub deflector. The deflection distance LSF is necessary to carry out a subsequent shot. From the calculated deflection distance LSF, a necessary settling time TSF of the sub deflector is obtained.

(Step S105)

The operation determines whether or not the two patterns extracted in step S102 are patterns to be transferred as same characters. If the operation has determined the patterns to be transferred as the same characters, the operation proceeds to step S106. If the patterns have been determined not to be same characters, the operation proceeds to step S107.

(Step S106)

The settling time TSF of the sub deflector, which has been obtained in step S103, is registered into an inter-shot distance table as a settling time necessary between the two shots extracted in step S103. After the registration, the operation proceeds to step S110.

The inter-shot distance table is used to store data of settling times, which are necessary between individual shots, for all associations of shots in one of the sub deflection regions. The settling times are used as parameters to sort shots by using the "traveling salesman problem (TSP)" solution algorithm.

(Step S107)

From the position of a character aperture corresponding to the character pattern extracted in step S102, a distance Lcp by which the electron beam is deflected on a CP aperture is calculated, and one character beam is applied. Thereafter, the operation is performed to obtain a settling time TCP of the shaping deflector, which the wait time is necessary to shape a subsequent character beam.

(Step S108)

The operation performs a comparison between values of the settling time TSF of the sub deflector, which has been obtained in step S104, and the settling time TCP of the shaping deflector, which has been obtained in step S107. In this case, the operation determines whether or not the relation TCP<TSF is satisfied. If the relation TCP<TSF is determined to be satisfied, the operation proceeds to step S106; whereas if the relation TCP<TSF is not satisfied, the operation proceeds to step S109.

(Step S109)

As a result of the determination of step S108, suppose the relation TCP<TSF is determined to be unsatisfied, and the settling time TCP of the shaping deflector needs to be set longer than the settling time TSF of the sub deflector. In this case, the settling time TCP of the shaping deflector, which has been obtained in step S107, is registered into the inter-shot distance table. After the registration, the operation proceeds to step S110.

(Step S110)

For all the associations of two character patterns, the operation determines whether or not settling times necessary between the individual shots have been registered into the inter-shot distance table.

If an unregistered association has been detected, the operation returns to step S103.

If the inter-shot wait times for all the associations have been registered into the table, the operation proceeds to step Sill.

(Step S111)

The inter-shot distance table generated through iteration of the individual steps described above is referenced, the "traveling salesman problem (TSP)" solution algorithm is used, and all the shot patterns in the sub deflection region are sorted. At this event, in accordance with the TSP algorithm, the shots are sorted to further shorten a time resulting from totaling the settling times registered in the inter-shot distance table corresponding to a selection sequence of the shots.

(Step S112)

An exposure sequence obtained by thus performing sorting is output as exposure data.

The exposure data is created as described above. Then, using the created exposure data, the semiconductor device pattern is transferred by the electron-beam exposure apparatus. Thereby, the advantages/effects described in the first embodiment can be secured.

THIRD EMBODIMENT

In a third embodiment of the invention, a description will be provided regarding sorting that uses the characteristics of the settling times of the sub deflector 413 and the shaping deflector 409 with respect to the deflection distances and that thereby uses different parameters.

In a deflector of the type having first-dimensional linear characteristics as shown in FIG. 4, equation (2) takes the form as shown below in accordance with the equation representing the characteristics of the settling time tCP of the shaping deflector 409 of the first embodiment:

$$t_{CP} = \alpha \cdot f\left(\frac{L_{CP}}{M}\right) = f\left(\frac{\alpha L_{CP}}{M}\right) = f(L'_{CP}) \quad (6)$$

In a form corresponding to the above, it is apparent that the settling time tCP of the setting deflector that is used in the first embodiment is expressed as follows:

$$t_{CP} = 2 \cdot f\left(\frac{3.2 L_{CP}}{10}\right) + 100 \text{ [ns]} \quad (7)$$

Accordingly, using the same equation representing the settling time, the deflection distance can be converted for the sub deflector 413 and the shaping deflector 409, as follows:

$$L'_{CP} = \alpha \cdot \frac{L_{CP}}{M} = 0.32 L_{CP} \quad (8)$$

The converted deflection distance L'CP is a parameter resulting from the conversion of the deflection distance Lcp of electron-beam deflected the shaping deflector to the deflection distance LSF of electron-beam deflected the sub deflector.

Consequently, the settling times of the two deflectors need not be calculated and compared with each other. In this case, the deflection distance LSF of electron-beam deflected the sub deflector may be compared with the distance L'CP converted from the deflection distance of electron-beam deflected the shaping deflector. According to the result of the comparison, the longer distance is used as an inter-shot relative deflection distance.

The same effects as those in the first embodiment can be secured even in the case where the shots are sorted using LSF and L'CP as parameters.

As in the present embodiment, from the correlation between the relative deflection distances of electron-beam deflected the two deflectors in accordance with the settling times of the two deflector, the relative deflection distance can be obtained through conversion from the deflection distance required for the one deflector to the deflection distance of electron-beam deflected the other deflector.

Using the total deflection distance and the other deflection distance as parameters, sorting of the character patterns is performed to obtain the exposure sequence of the patterns. Thereby, the algorithm used for calculation can be simplified. Concurrently, the time for sorting, that is, the time required for creation of the electron-beam exposure data can be reduced.

In this embodiment, the correlation between the beam deflection distances of electron-beam deflected the two deflector is obtained in accordance with the settling times of the two deflectors. However, the correlation between the deflection distances of electron-beam deflected the two deflectors may be obtained without following the settling times of the two deflectors. For example, the per-shot deflection distance can be reduced. Consequently, not only positional deviations of shots, beam-shaping errors, and the like can be suppressed, writing precision can be improved, and the production yield can be improved, but also the performance of semiconductor devices to be manufactured can be improved.

Further, since long deflections are reduced, an excessively high performance is not required for each of the deflectors. Consequently, semiconductor device development and maintenance of the exposure apparatus are facilitated, and concurrently, reductions in development costs for semiconductor devices and maintenance costs for the exposure apparatus can be expected to be implemented.

Suppose the correlation between the deflection distances of electron-beam deflected the two deflectors is obtained without following the settling times of the two deflectors. In this case, even when a variation occurs in the characteristics of the settling time with respect to the deflection distance in FIG. 4, sorting, that is, the creation of electron-beam exposure data, need not be repeated as long as the same deflection sensitivity ratio is maintained. Consequently, no instance occurs in which the time for performing electron beam exposure is wasted.

FOURTH EMBODIMENT

In a fourth embodiment of the invention, the exposure-data creation method described in the third embodiment will be described in more detail hereinbelow.

Figure 17:
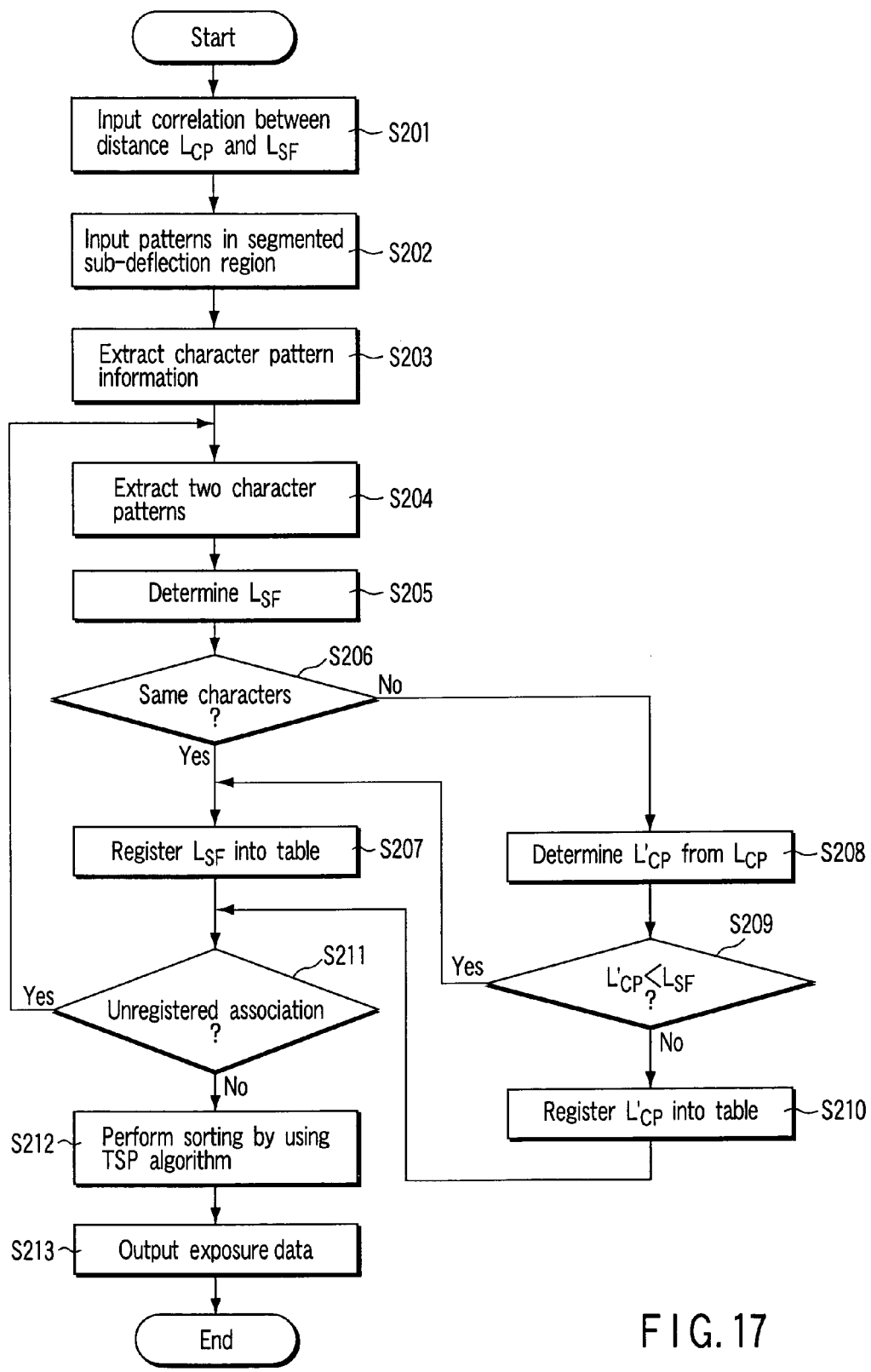
FIG. 17 is a flowchart of an exposure-data creation method according to a fourth embodiment of the invention.

FIG. 17 is a flowchart of an exposure-data creation method according to a fourth embodiment of the invention.

The exposure-data creation method may be implemented in a hardware configuration and/or a software configuration. In the case of a software configuration used for the implementation, a program for performing operation to implement corresponding functions is preinstalled into a computer from a storage medium or a network. This is the same for an apparatus according to another embodiment described below.

(Step S201)
Input is performed for data representing the correlation between the deflection distance of electron-beam deflected the shaping deflector and the deflection distance of electron-beam deflected the sub deflector in accordance with settling times of the two deflectors. As described in the third embodiment, the correlation is expressed by the following equation:

$$L'_{CP} = \alpha \cdot \frac{L_{CP}}{M} = 0.32 L_{CP} \quad (8)$$

If the correlation is not yet known, the correlation is obtained and input.

(Step S202)
Pattern data representing extracted character patterns is input into a computer. The pattern data is created such that a circuit pattern of a semiconductor device to be transferred is segmented into a plurality of sub deflection regions, and character patterns contained in the individual sub deflection regions are extracted.

(Step S203)
The individual character patterns contained in the individual sub deflection regions are extracted from the input pattern data. Information extracted therein contains at least the positions of shots to a specimen for the individual character patterns and the type of a character aperture for the character patterns.

(Step S204)
Two character patterns are extracted from those contained in one of the sub deflection regions.

(Step S205)
One of the character patterns is transferred with a shot from the shot positions for the two character patterns extracted in step S204. Subsequently, the operation calculates a deflection distance LSF of an electron beam that is to be deflected by a sub deflector on the specimen. The deflection distance LSF is necessary to carry out a subsequent shot.

(Step S206)
The operation determines whether or not the two patterns extracted in step S204 are patterns to be transferred as same characters. If the operation has determined the patterns to be transferred as the same characters, the operation proceeds to step S207. If the patterns have been determined not to be same characters, the operation proceeds to step S208.

(Step S207)
At the event that the patterns are determined to be transferred as the same characters in step S206, the deflection distance LSF of electron-beam deflected the shaping deflector is registered into an inter-shot distance table as an inter-shot relative deflection distance. After the registration, the operation proceeds to step S211.

(Step S208)
At the event that the patterns are not determined to be transferred as the same characters in step S206, from the position of a character aperture corresponding to the character pattern extracted in step S204, a distance Lcp by which the electron beam is deflected on a CP aperture is calculated. Then, the distance Lcp is converted to a distance L'CP by using equation (8).

$$L'_{CP} = \alpha \cdot \frac{L_{CP}}{M} = 0.32 L_{CP} \quad (8)$$

(Step S209)
The operation performs a comparison between values of the deflection distance LSF, which has been obtained in step S205, and the deflection distance L'CP, which has been obtained in step S208. In this case, the operation determines whether or not the relation L'CP<LSF is satisfied. If the relation L'CP<LSF is determined to be satisfied, the operation proceeds to step S207; whereas if the relation L'CP<LSF is not satisfied, the operation proceeds to step S210.

(Step S210)
At the event that the relation L'CP<LSF is determined in step S208 to be unsatisfied, the deflection distance L'CP, which has been obtained in step S208, is registered into the inter-shot distance table as an inter-shot relative deflection distance. After the registration, the operation proceeds to step S211.

(Step S211)
For all the associations of two character patterns, the operation determines whether or not settling times necessary between the individual shots have been registered into the inter-shot distance table.

If an unregistered association has been detected, the operation returns to step S204.

If the inter-shot wait times for all the associations have been registered into the table, the operation proceeds to step S212.

(Step S212)
The inter-shot distance table generated through iteration of the individual steps described above is referenced, the "traveling salesman problem (TSP)" solution algorithm is used, and all the shot patterns in the sub deflection region are sorted. At this event, in accordance with the TSP algorithm, the shots are sorted to further shorten a time resulting from totaling the settling times registered in the inter-shot distance table corresponding to a selection sequence of the shots.

(Step S213)

An exposure sequence obtained by thus performing sorting is output as exposure data.

The exposure data is created as described above.

Using the created exposure data, the semiconductor device pattern is transferred by the electron-beam exposure apparatus. Thereby, the advantages/effects described in the first and third embodiments can be secured.

The method described in each of the embodiments can be stored as a computer-executable program into a storage medium and can be distributed in the form of the storage medium. Examples of the storage medium include, for example, a magnetic disk (such as a floppy (registered trademark) disk or hard disk), an optical disk (such as a CD-ROM and DVD), a magneto-optical (MO) disc, and a semiconductor memory.

The storage medium may be of any type as long as it has a capacity of storing the program and is computer readable.

Individual processes for implementing the individual embodiments may partly be executed by means of, for example, an OS (operating system), database management software, and MW (middleware) such as network software that run in a computer in response to commands of the program installed into the computer from the storage medium.

The storage medium according to embodiments of the invention is not limited to a storage medium independent of the computer; and usable media include a storage medium into which the program is transmitted via, for example, a LAN or the Internet, is downloaded, and stored or temporarily stored.

A case where the processes according to the embodiments are executed by the program read out of a plurality of storage media is included in the scope of embodiments of the invention in regard to the storage medium, and the medium configuration may be any one of the configurations.

The computer according to embodiments of the invention is used to execute individual processes according to the embodiments in accordance with the program stored into the storage medium, and it may be of any configuration type, such as a device configured of one personal computer or a system in which a plurality of devices are connected via a network.

The computer according to the embodiments of invention is not limited to a personal computer, and it generically refers to any one of apparatuses and devices that are capable of implementing functions of the embodiments of invention through the program. Examples of the computer include a processing unit included in an information processor, and a microcomputer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for creating charged-particle-beam exposure data containing a description of an exposure sequence of character patterns in a deflection region of a specimen to perform exposure of a charged particle beam according to a character projection technique, comprising:

selecting a first value or a second value as a parameter to transfer one character pattern and then transferring a subsequent character pattern, the first value regarding performance of a shaping deflector which deflects the charged particle beam so that the charged particle beam is applied to an arbitrarily character aperture formed in a CP (character projection) aperture mask and a character beam having the shape of the character aperture is thereby created, and the second value regarding performance of an objective deflector which deflects the character beam so that the character beam is applied to an arbitrarily position of the deflection region of the specimen; and determining the exposure sequence of the character patterns in the deflection region in accordance with the selected parameter.

2. The method for creating charged-particle-beam exposure data according to claim 1, wherein a settling time of the shaping deflector is compared with a settling time of the objective deflector for each character pattern, and a longer one of the settling times is selected as the parameter for said each character pattern; and when performing exposures of all character patterns in the deflection region, the exposure sequence of the character patterns is determined so that a sum of selected settling times for said all character patterns is minimum.

3. The method for creating charged-particle-beam exposure data according to claim 2, wherein the exposure sequence of the character patterns is determined by using a "traveling salesman problem" solution algorithm so that a sum of selected settling times for said all character patterns is minimum.

4. The method for creating charged-particle-beam exposure data according to claim 1, wherein a correlation between a deflection distance of the charged particle beam deflected by the shaping deflector on the CP aperture mask and a deflection distance of the character beam deflected by the objective deflector on the specimen is obtained;

in case where two character patterns are sequentially transferred, when a first deflection distance of the character beam deflected by the objective deflector and a second deflection distance resulting from converting a deflection distance of the charged particle beam deflected by the shaping deflector in accordance with the correction are compared with each other, a longer one of the first deflection distance and the second deflection distance is selected as the parameter; and when performing exposures of all character patterns in the deflection region, the exposure sequence of the character patterns is determined so that a sun of selected deflection distances for said all character patterns is minimum.

5. The method for creating charged-particle-beam exposure data according to claim 4, wherein the correlation is obtained in accordance with the settling times of the shaping deflector and the objective deflector.

6. The method for creating charged-particle-beam exposure data according to claim 4, wherein the exposure sequence of the character patterns is determined by using a "traveling salesman problem" solution algorithm so that a sum of selected deflection distances for said all character patterns is minimum.

7. A method for manufacturing a semiconductor device, wherein a charged-particle-beam exposure of a semiconductor device pattern is performed by using exposure data created in accordance with the method for creating charged-particle-beam exposure data defined in claim 1.

8. A program for implementing a function of creating exposure data containing a description of an exposure sequence of character patterns in a deflection region of a specimen to perform exposure of a charged particle beam according to a character projection technique, the program comprising:

a function that works such that a first value or a second value is selected as a parameter to transfer one character pattern and then transferring a subsequent character pattern, the first value regarding performance of a shaping deflector which deflects the charged particle beam so that the charged particle beam is applied to an arbitrarily character aperture formed in a CP character projection) aperture mask and a character beam having the shape of the character aperture is thereby created, and the second value regarding performance of an objective deflector which deflects the character beam so that the character beam is applied to an arbitrarily position of the deflection region of the specimen; and a function that works such that the exposure sequence of the character patterns in the deflection region is determined in accordance with the selected parameter.

9. The program according to claim 8, wherein a settling time of the shaping deflector is compared with a settling time of the objective deflector for said character pattern, and a longer one of the settling times is selected as the parameter for said each character pattern; and when performing exposures of all character patterns in the deflection region, the exposure sequence of the character patterns is determined so that a sum of selected settling times for said all character patterns is minimum.

10. The program according to claim 9, wherein the exposure sequence of the character patterns is determined by using a "traveling salesman problem" solution algorithm so that a sum of selected settling times for said all character patterns is minimum.

11. The program according to claim 8, wherein a correlation between a deflection distance of the charged particle beam deflected by the shaping deflector on the CP aperture mask and a deflection distance of the character beam deflected by the objective deflector on the specimen is obtained;

in case where two character patterns are sequentially transferred, when a first deflection distance of the character beam deflected by the objective deflector and a second deflection distance resulting from converting a deflection distance of the charged particle beam deflected by the shaping deflector in accordance with the correction, are compared with each other, a longer one of the first deflection distance and the second deflection distance is selected as the parameter; and when performing exposures of all character patterns in the deflection region, the exposure sequence of the character patterns is determined so that a sum of selected deflection distances for said all character patterns is minimum.

12. The program according to claim 11, wherein the exposure sequence of the character patterns is determined by using a "traveling salesman problem" solution algorithm so that a sum of selected deflection distances for said all character patterns is minimum.

* * * * *

UNITED STATES PATENT AND TRADEMARK OFFICE
CERTIFICATE OF CORRECTION

| | |
|---|---|
| PATENT NO. | : 7,076,761 B2 |
| APPLICATION NO. | : 10/642680 |
| DATED | : July 11, 2006 |
| INVENTOR(S) | : Inanami et al. |

Page 1 of 1

It is certified that error appears in the above-identified patent and that said Letters Patent is hereby corrected as shown below:

Claim 4, column 18, line 55, change "sun" to --sum--.

Claim 8, column 19, lines 18-19, change "CP character projection)" to --CP (character projection)--.

Signed and Sealed this

Nineteenth Day of September, 2006

JON W. DUDAS
*Director of the United States Patent and Trademark Office*